United States Patent
Aoyama et al.

(10) Patent No.: US 7,737,370 B2
(45) Date of Patent: Jun. 15, 2010

(54) ELECTROMAGNETIC SHIELDING FILTER

(75) Inventors: Seigi Aoyama, Kitaibaraki (JP); Toshiyuki Horikoshi, Hitachi (JP); Hiromitsu Kuroda, Hitachi (JP); Yuzo Ito, Mito (JP); Hiroshi Komuro, Hitachi (JP); Hiroshi Okikawa, Hitachi (JP)

(73) Assignee: Hitachi Cable, Ltd., Chiyoda-ku, Tokyo (JP)

( * ) Notice: Subject to any disclaimer, the term of this patent is extended or adjusted under 35 U.S.C. 154(b) by 146 days.

(21) Appl. No.: 11/882,089

(22) Filed: Jul. 30, 2007

(65) Prior Publication Data

US 2008/0047747 A1 Feb. 28, 2008

(30) Foreign Application Priority Data

Jul. 31, 2006 (JP) ............................. 2006-208591

(51) Int. Cl.
*H05K 9/00* (2006.01)
(52) U.S. Cl. ...................... 174/389; 174/392; 313/313
(58) Field of Classification Search .................. 174/377, 174/388, 392, 389; 313/313
See application file for complete search history.

(56) References Cited

U.S. PATENT DOCUMENTS

| | | | |
|---|---|---|---|
| 2005/0285526 A1* | 12/2005 | Moon et al. | 313/582 |
| 2006/0154092 A1 | 7/2006 | Naito et al. | |
| 2008/0202648 A1* | 8/2008 | Aoyagi et al. | 148/554 |

FOREIGN PATENT DOCUMENTS

| | | |
|---|---|---|
| CN | 1522107(A) | 8/2004 |
| JP | 2000-174488 | 6/2000 |
| JP | 2001-22283 | 1/2001 |
| TW | 240233 | 9/2005 |

OTHER PUBLICATIONS

Chinese Office Action dated Jan. 16, 2009 with English-Language Translation.
Chinese Office Action dated Feb. 5, 2010, with English translation.

* cited by examiner

*Primary Examiner*—Hung V Ngo
(74) *Attorney, Agent, or Firm*—McGinn Intellectual Property Law Group, PLLC

(57) ABSTRACT

An electromagnetic shielding filter has two transparent boards and a conductive mesh with plural wires, where the conductive mesh is sandwiched between the two transparent boards. The plural wires are formed of a Cu—Sn—In alloy or a Cu—Ag alloy.

10 Claims, 1 Drawing Sheet

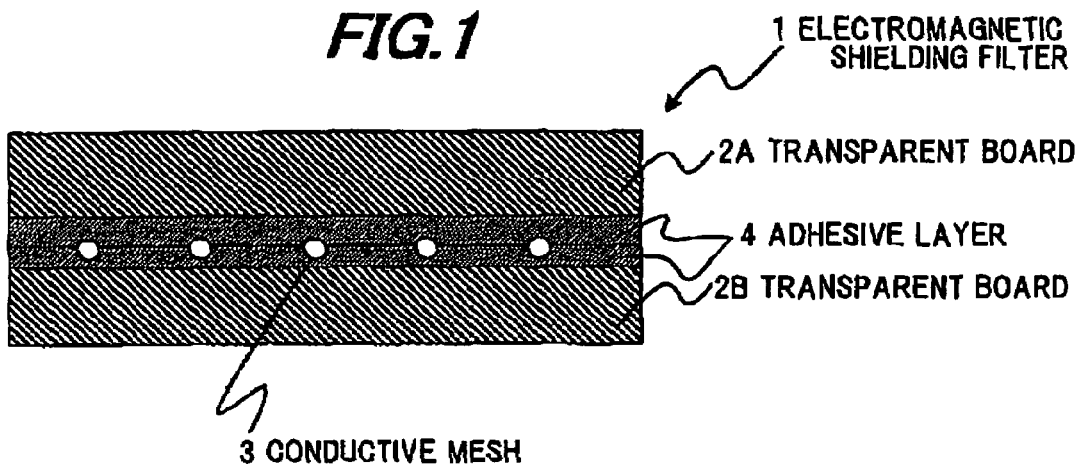
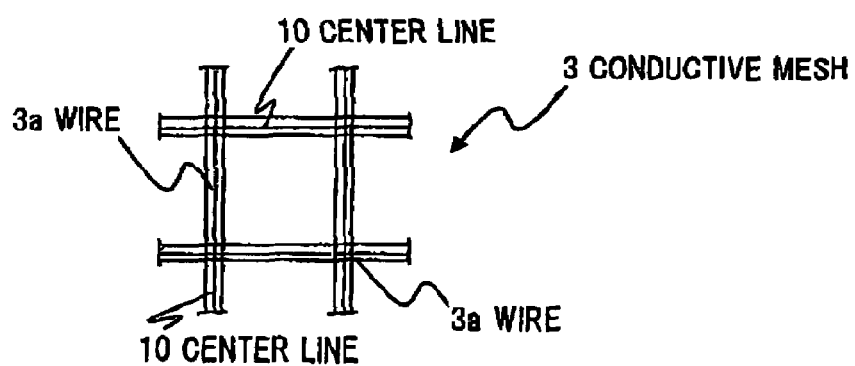

ELECTROMAGNETIC SHIELDING FILTER

The present application is based on Japanese patent application No. 2006-208591, the entire contents of which are incorporated herein by reference.

BACKGROUND OF THE INVENTION

1. Field of the Invention

This invention relates to an electromagnetic shielding filter composed of a plastic or glass board and attached at the front of a display device and, in particular, to an electromagnetic shielding filter suitably adapted for a plasma display panel (PDP) TV. Also, this invention can be adapted for a field emission display (FED) or cathode-ray tube (CRT) monitor.

2. Description of the Related Art

Display devices such as PDP, CRT and FED emit unnecessary electromagnetic waves which may cause a malfunction or noise in peripheral devices or be harmful to humans. Therefore, they need to be equipped with some electromagnetic shielding filter to eliminate the electromagnetic waves. General electrical devices can be electromagnetic-shielded by disposing a conductor around them. However, in case of the display devices, the electromagnetic shielding filter needs to be transparent as well as being conductive.

JP-A-2000-174488 discloses an electromagnetic shielding transparent window material that is composed of two transparent boards and a conductive mesh formed of a metal covered conductive fiber and disposed between the boards, where the mesh is integrated with the boards by an adhesive resin.

The transparent board of the electromagnetic shielding transparent window material are generally made of plastic or glass. The plastic or glass board has a serious defect in aspect of the mechanical strength that it may cause a crack when a strong load is externally applied thereto. Thus, the transparent board needs to have a breaking strength property against the external force to protect the panel from the external force.

In order to compensate the mechanical strength of the electromagnetic shielding transparent window material, JP-A-2000-174488 teaches using a special chemical reinforced glass for at least one of the two transparent boards. However, in this approach, the production cost must be increased since the special chemical reinforced glass is used instead of the commercially-available plastic film.

On the other hand, the electromagnetic shielding filter needs to be lightweight as well as the mechanical strength above a certain level since it is attached at the front of the display panel. In order to make the filter lightweight, it is proposed to reduce the thickness of the transparent board. However, in this way, the strength of the whole electromagnetic shielding filter cannot be secured. In general, the mechanical strength is incompatible with the weight saving. Thus far, the incompatible properties are difficult to satisfy together in the conventional display front filter board.

JP-A-2001-22283 discloses an electromagnetic shielding filter having transparency and conductivity, which is produced such that a conductive metal is deposited on a transparent board and a mesh wiring is then formed by etching it, or a mesh structure is formed by arranging wires in the length and width directions. However, in case of forming the mesh wiring by etching, the production cost will be increased and the transparency (wire invisibility) thereof is too low to meet the market needs.

In case of forming the mesh structure by arranging wires in the length and width directions, the diameter of a wire available is as large as about 30 to 40 μm and, therefore, must be further reduced to satisfy the transparency (wire invisibility). In case of wires, the normal wire drawing process needs to conduct the annealing several times during the operation and it is difficult to produce a ultrafine wire as thin as 20 μm φ from a normal copper or copper alloy material. Thus, it is desired that a wire material for the electromagnetic shielding filter has such a ultrafine-wire processability that does not cause a breaking even in tough area reduction processing so as to produce the ultrafine wire with a diameter of 20 μm φ or less.

SUMMARY OF THE INVENTION

It is an object of the invention to provide an electromagnetic shielding filter that is excellent in electromagnetic shielding property, transparency (wire invisibility), mechanical strength and weight saving.

(1) According to one embodiment of the invention, an electromagnetic shielding filter comprises:

two transparent boards; and a conductive mesh comprising a plurality of wires, the conductive mesh being sandwiched between the two transparent boards, wherein the plurality of wires comprise a Cu—Sn—In alloy or a Cu—Ag alloy.

In the above embodiment (1), the following modifications and changes can be made.

(i) The Cu—Sn—In alloy comprises a Cu-0.15 to 0.25 mass % Sn-0.15 to 0.25 mass % In alloy.

(ii) The Cu—Ag alloy comprises a Cu-1.0 to 5.0 mass % Ag alloy.

(iii) The plurality of wires further comprise a Sn layer or a Ag layer with a thickness of 0.1 μm to 1.0 μm formed on a periphery thereof.

(iv) The two transparent boards comprise a thickness of 0.01 mm to 0.5 mm.

(v) The plurality of wires comprise a diameter of not less than 10 μm and less than 25 μm, and the conductive mesh comprises an aperture of 85 to 95%.

(2) According to anther embodiment of the invention, an electromagnetic shielding filter comprises:

two transparent boards; and a conductive mesh comprising a plurality of wires, the conductive mesh being sandwiched between the two transparent boards, wherein the plurality of wires comprise a diameter of not less than 10 μm and less than 25 μm, and the conductive mesh comprises an aperture of 85 to 95%.

In the above embodiment (2), the following modifications and changes can be made.

(vi) The plurality of wires comprise a Cu-0.15 to 0.25 mass % Sn-0.15 to 0.25 mass % In alloy or a Cu-1.0 to 5.0 mass % Ag alloy.

The above embodiments has the features that the wires have a diameter less than 25 μm, and the conductive mesh are composed of the wires that are formed of the Cu—Sn—In alloy or the Cu—Ag alloy having a high tensile strength while keeping the reduction of the electrical conductivity minimum. Thus, the conductive mesh can have conductivity sufficient to give an effective electromagnetic shielding property and such a high tensile strength that it can serve as a reinforcing member for the thinned transparent boards. Therefore, even when the transparent boards have a reduced thickness, the whole electromagnetic shielding filter can secure a high mechanical strength.

The conductive mesh formed of the Cu—Sn—In alloy or the Cu—Ag alloy can be composed of the ultrafine wires of not less than 10 μm and less than 25 μm so that the transparency (wire invisibility) can be enhanced to meet the market needs.

Furthermore, since the electromagnetic shielding filter needs not be provided with a further member for reinforcing the thinned transparent boards, the filter can be reduced in weight. Also, since it is unnecessary to use the special chemical reinforced glass etc. as the transparent boards, the production cost can be kept low.

BRIEF DESCRIPTION OF THE DRAWINGS

The preferred embodiments according to the invention will be explained below referring to the drawings, wherein:

FIG. 1 is a schematic cross sectional view showing partially an electromagnetic shielding filter in a preferred embodiment according to the invention; and FIG. 2 is a schematic enlarged diagram showing partially an electromagnetic shielding portion with a composite mesh structure of the invention.

DETAILED DESCRIPTION OF THE PREFERRED EMBODIMENTS

The electromagnetic shielding filter in the preferred embodiment according to the invention will be detailed below with reference to FIGS. 1-2.

FIG. 1 is a schematic cross sectional view showing partially an electromagnetic shielding filter in the preferred embodiment according to the invention. FIG. 2 is a schematic enlarged diagram showing partially an electromagnetic shielding portion with a composite mesh structure of the invention.

As shown in FIG. 1, the electromagnetic shielding filter 1 is composed of two transparent boards 2A, 2B, a conductive mesh 3 formed with plural wires 3a (each having a center line 10) arranged in the length and width directions to be orthogonal to each other like a lattice (See FIG. 2), and an adhesive layer 4 formed on the surface of each of the transparent boards such that the two transparent boards 2A, 2B are bonded together through the adhesive layer 4 while sandwiching the conductive mesh 3 therebetween.

The transparent boards 2A, 2B can be made of, e.g., glass, polyester, polyethylene, polyethylene terephthalate (=PET), polybutylene terephthalate (=PBT), polymethylmethacrylate (=PMMA), an acrylic plate, polycarbonate (=PC), polystyrene, a polyacetate film, polyvinyl alcohol, polyvinyl chloride (=PVC), polyvinylidene chloride, polyethylene, ethylene-vinyl acetate copolymer, polyvinyl butyral, polyurethane etc.

The transparent boards 2A, 2B has a thickness determined according to the requirements for strength and weight saving, and the thickness can be, e.g., in the range of 0.1 mm to 10 mm.

The transparent boards 2A, 2B need not always be formed of the same material. For example, the board 2A on the front side can be formed of glass and the board 2B can be formed of a PET film or plate, an acrylic film or plate, or polycarbonate film or plate.

The conductive mesh 3 sandwiched between the transparent boards 2A and 2B can be formed as follows.

The conductive mesh 3 formed of a Cu—Sn—In alloy or a Cu—Ag alloy is to be composed of a wire with a diameter of not less than 10 μm and less than 25 μm. This is because if the wire has a diameter of 25 μm or more, the wire can be easily recognized by human eyes so that it may prevent the visibility of a display when the filter is applied to a PDP etc. On the other hand, if the wire has a diameter of less than 10 μm, the wire becomes difficult to produce and the production cost will be very expensive even if it were produced.

The conductive mesh 3 formed of the Cu—Sn—In alloy or Cu—Ag alloy is to have an aperture of 85 to 95%. This is because if less than 85%, it may prevent the visibility of a display and if more than 95%, the attenuation of electromagnetic wave at a target frequency (300 Hz) or so will be reduced so that the effect of the electromagnetic shielding filter cannot be secured.

In the conductive mesh 3, a wire diameter of 25 μm or more will lead to an aperture less than 85%, and a wire diameter less than 8 μm will lead to an aperture more than 95%.

Examples according to the invention will be detailed below as well as Comparative Examples.

Example 1

As a metal wire for composing a conductive mesh, a Cu-0.19 mass % Sn −0.20 mass % In alloy wire with a diameter of 20 μm φ is used. The alloy wire is previously Ag-plated on the periphery thereof. The mesh structure is formed such that the several alloy wires are aligned crosswise and the other several wires are aligned lengthwise orthogonally to the wires crosswise. The lattice obtained by the mesh structure has a side length of 300 μm and an aperture area of 87.1%. A long sheet of the mesh structure is wound on a take-up roll (mesh long sheet formation step).

Then, the mesh long sheet is fed out continuously from the roll while being aligned by a guide pulley, and is simultaneously sandwiched vertically by planar 0.05 mm PET films (transparent boards 2A, 2B) with a transparent adhesive layer wound on a bobbin. Then, the PET films are continuously bonded together by a rolling hot roll (at a rolling temperature of 150° C.) to produce the lengthy electromagnetic shielding filter with the mesh long sheet disposed on the adhesive layer formed on the surface of the PET films. The filter is then wound on a take-up bobbin.

The lengthy electromagnetic shielding filter thus produced is cut into a proper form and length (180 cm×90 cm in length and width, and 6000×3000 in the number of lengthwise and crosswise metal wires) to adapt for the form and surface area of a display device. Thus, the electromagnetic shielding filter is obtained.

Example 2

As the metal wire for composing the conductive mesh, a Cu-0.19 mass % Sn −0.20 mass % In alloy wire with a diameter of 16 μm φ is used. The mesh structure has an aperture area of 89.6%. The other conditions are the same as in Example 1 for producing an electromagnetic shielding filter of Example 2.

Example 3

As the metal wire for composing the conductive mesh, a Cu-0.19 mass % Sn −0.20 mass % In alloy wire with a diameter of 13 μm φ is used. The mesh structure has an aperture area of 91.5%. The other conditions are the same as in Example 1 for producing an electromagnetic shielding filter of Example 3.

Example 4

As the metal wire for composing the conductive mesh, a Cu-2.0 mass % Ag alloy wire with a diameter of 20 μm φ is used. The other conditions are the same as in Example 1 for producing an electromagnetic shielding filter of Example 4.

Example 5

As the metal wire for composing the conductive mesh, a Cu-2.0 mass % Ag alloy wire with a diameter of 16 μm φ is used. The mesh structure has an aperture area of 89.6%. The other conditions are the same as in Example 1 for producing an electromagnetic shielding filter of Example 5.

Example 6

As the metal wire for composing the conductive mesh, a Cu-2.0 mass % Ag alloy wire with a diameter of 13 μm φ is used. The mesh structure has an aperture area of 91.5%. The other conditions are the same as in Example 1 for producing an electromagnetic shielding filter of Example 6.

Comparative Example 1

As the metal wire for composing the conductive mesh, a Cu-0.19 mass % Sn −0.20 mass % In alloy wire with a diameter of 25 μm φ is used. The mesh structure has an aperture area of 84.0%. The other conditions are the same as in Example 1 for producing an electromagnetic shielding filter of Comparative Example 1.

Comparative Example 2

As the metal wire for composing the conductive mesh, a Cu-2.0 mass % Ag alloy wire with a diameter of 25 μm φ is used. The mesh structure has an aperture area of 84.0%. The other conditions are the same as in Example 1 for producing an electromagnetic shielding filter of Comparative Example 2.

Comparative Example 3

As the metal wire for composing the conductive mesh, a oxygen-free copper (OFC) wire with a diameter of 25 μm φ is used. The mesh structure has an aperture area of 84.0%. The other conditions are the same as in Example 1 for producing an electromagnetic shielding filter of Comparative Example 3.

Comparative Example 4

As the metal wire for composing the conductive mesh, a oxygen-free copper (OFC) wire with a diameter of 20 μm φ is used. The mesh structure has an aperture area of 87.1%. The other conditions are the same as in Example 1 for producing an electromagnetic shielding filter of Comparative Example 4.

Comparative Example 5

As the metal wire for composing the conductive mesh, a tough pitch copper (TPC) wire with a diameter of 25 μm φ is used. The mesh structure has an aperture area of 84.0%. The other conditions are the same as in Example 1 for producing an electromagnetic shielding filter of Comparative Example 5.

Comparative Example 6

As the metal wire for composing the conductive mesh, a tough pitch copper (TPC) wire with a diameter of 20 μm φ is used. The mesh structure has an aperture area of 87.1%. The other conditions are the same as in Example 1 for producing an electromagnetic shielding filter of Comparative Example 6.

TABLE 1

The properties of the wire used for the conductive mesh

|  | Kind of metal (wt %) | Wire diameter (μmφ) | Conductivity (% IACS) | Strength (MPa) | Workability |
|---|---|---|---|---|---|
| Example 1 | Cu—0.19Sn—0.20In | 20 | 78.3 | 870 | Good |
| Example 2 | Cu—0.19Sn—0.20In | 16 | 78.2 | 880 | Good |
| Example 3 | Cu—0.19Sn—0.20In | 13 | 78.0 | 890 | Good |
| Example 4 | Cu—2.0Ag | 20 | 83.2 | 950 | Good |
| Example 5 | Cu—2.0Ag | 16 | 82.0 | 985 | Good |
| Example 6 | Cu—2.0Ag | 13 | 81.6 | 1000 | Good |
| Comp.Ex.1 | Cu—0.19Sn—0.20In | 25 | 78.6 | 850 | Good |
| Comp.Ex.2 | Cu—2.0Ag | 25 | 85.0 | 910 | Good |
| Comp.Ex.3 | OFC | 25 | 97.2 | 600 | Good |
| Comp.Ex.4 | OFC | 20 | 97.0 | 615 | No good |
| Comp.Ex.5 | TPC | 25 | 96.7 | 630 | Good |
| Comp.Ex.6 | TPC | 20 | 97.0 | 640 | No good |

The Evaluation of the Wire Used for the Conductive Mesh

The properties of a wire used for the conductive mesh are evaluated by the following method.

The conductivity (% IACS) is determined by measuring a resistivity by 4 probes method and using the diameter and length of a wire.

The strength (MPa) is determined by tensile test at a strain rate of $3 \times 10^{-3}$ ($s^{-1}$).

The workability is estimated by an average processing length when causing a breaking or a surface failure such as a flaw during the area reduction process into the wire diameter, where 30 km or more is determined "good".

In view of Table 1, the copper alloy wires in Examples 1 to 6 ate a lower conductivity and a higher tensile strength than the pure copper wires in Comparative Examples 3 to 6. Thus, it is confined that the conductive mesh using the copper alloy wires in Examples 1 to 6 have a higher mechanical strength than that using the pure copper wires in Comparative Examples.

Further, the copper alloy wires in Examples 1 to 6 has a stable drawing property even in the diameter region of less than 20 µm. However, the pure copper wires in Comparative Examples 4 and 6 cause a breaking or a surface failure such as a flaw are in the diameter region of 20 µm although they may be applicable at a diameter of 25 µm. Therefore, they are evaluated "no good" in workability.

TABLE 2

The properties of the electromagnetic shielding filter

| | Transparent board | | Wire | | | Electromagnetic shielding | | |
| --- | --- | --- | --- | --- | --- | --- | --- | --- |
| | Kind | Thickness (mm) | Kind | Aperture (%) | Diameter (µmφ) | property (300 MHz) | Transparency | Strength |
| Ex.1 | PET | 0.05 | Cu—Sn—In | 87.1 | 20 | >50 dB | Good | Good |
| Ex.2 | PET | 0.05 | Cu—Sn—In | 89.6 | 16 | >50 dB | Good | Good |
| Ex.3 | PET | 0.05 | Cu—Sn—In | 91.5 | 13 | >50 dB | Good | Good |
| Ex.4 | PET | 0.05 | Cu—Ag | 87.1 | 20 | >50 dB | Good | Good |
| Ex.5 | PET | 0.05 | Cu—Ag | 89.6 | 16 | >50 dB | Good | Good |
| Ex.6 | PET | 0.05 | Cu—Ag | 91.5 | 13 | >50 dB | Good | Good |
| C.Ex.1 | PET | 0.05 | Cu—Sn—In | 84.0 | 25 | >50 dB | NG | Good |
| C.Ex.2 | PET | 0.05 | Cu—Ag | 84.0 | 25 | >50 dB | NG | Good |
| C.Ex.3 | PET | 0.05 | OFC | 84.0 | 25 | >50 dB | NG | Good |
| C.Ex.4 | PET | 0.05 | OFC | 87.1 | 20 | >50 dB | Good | NG |
| C.Ex.5 | PET | 0.05 | TPC | 84.0 | 25 | >50 dB | NG | Good |
| C.Ex.6 | PET | 0.05 | TPC | 87.1 | 20 | >50 dB | Good | NG |

Note:
Ex.1 = Example 1;
C.Ex.1 = Comparative Example 1;
PET = polyethylene terephthalate sheet;
NG = no good The Evaluation of Properties of the Electromagnetic Shielding Filter The properties of the conductive mesh are evaluated by the following method.

The aperture (%) is determined by subtracting an area occupied by the wires from the entire area of the mesh structure.

The electromagnetic shielding property is determined by a field intensity attenuation measured by an EMI shield measurement system.

The transparency (or wire invisibility) is determined by an average visible light transmittance at 380 nm to 780 nm measured by a spectrometer.

The strength (breaking stress) is determined by a falling-ball breaking test, where a steel ball with a diameter of 38 mm and a weight of 277 g is fell on the mesh structure from a 100 mm height, and it is evaluated "no good" when the transparent board or the wire is broken by the test.

In view of Table 2, the electromagnetic shielding filters in Examples 1 to 6 are excellent in transparency and strength although they are the same electromagnetic shielding property as Comparative Examples.

Although the electromagnetic shielding filters in Comparative Examples 1-3 and 5 are good in electromagnetic shielding property and strength, they are evaluated "no good" in transparency (wire invisibility) since they use the 25 µm wire thicker than Examples. Although the electromagnetic shielding filters in Comparative Examples 4 and 6 are good in electromagnetic shielding property and in transparency (wire invisibility), they are evaluated "no good" in strength (breaking stress) since they use the wire with tensile strength lower than Examples.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. An electromagnetic shielding filter, comprising:
   two transparent boards; and
   a conductive mesh comprising a plurality of wires, the conductive mesh being sandwiched between the two transparent boards,
   wherein the plurality of wires comprises a Cu—Sn—In alloy comprising 0.15 mass % to 0.25 mass % of Sn and 0.15 mass % to 0.25 mass % of In, and
   wherein the plurality of wires further comprises an Sn layer or an Ag layer with a thickness of 0.1 µm to 1.0 µm formed on a periphery thereof.

2. The electromagnetic shielding filter according to claim 1, wherein the two transparent boards comprise a thickness of 0.01 mm to 0.5 mm.

3. The electromagnetic shielding filter according to claim 1, wherein the plurality of wires further comprises a diameter of not less than 10 µm and less than 25 µm, and
   wherein the conductive mesh further comprises an aperture of 85% to 95%.

4. An electromagnetic shielding filter, comprising:
   two transparent boards; and
   a conductive mesh sandwiched between the two transparent boards, the conductive mesh comprising a plurality of wires, the plurality of wires comprising a periphery layer disposed on a periphery of the plurality of wires, the periphery layer comprising one of Sn and Ag and having a thickness in a range from 0.1 µm to 1.0 µm, wherein the plurality of wires further comprises a Cu—Sn—In alloy comprising 0.15 mass % to 0.25 mass % of Sn and 0.15 mass % to 0.25 mass % of In.

5. An electromagnetic shielding filter, comprising:
two transparent boards; and
a conductive mesh sandwiched between the two transparent boards, the conductive mesh comprising a plurality of wires, the plurality of wires comprising a periphery layer disposed on a periphery of the plurality of wires, the periphery layer comprising one of Sn and Ag and having a thickness in a range from 0.1 µm to 1.0 µm,
wherein the plurality of wires further comprises a Cu—Sn—In alloy comprising 0.15 mass % to 0.25 mass % of Sn.

6. An electromagnetic shielding filter, comprising:
two transparent boards; and
a conductive mesh sandwiched between the two transparent boards, the conductive mesh comprising a plurality of wires, the plurality of wires comprising a periphery layer disposed on a periphery of the plurality of wires, the periphery layer comprising one of Sn and Ag and having a thickness in a range from 0.1 µm to 1.0 µm,
wherein the plurality of wires further comprises a Cu—Sn—In alloy comprising 0.15 mass % to 0.25 mass % of In.

7. An electromagnetic shielding filter, comprising:
two transparent boards; and
a conductive mesh sandwiched between the two transparent boards, the conductive mesh comprising a plurality of wires, the plurality of wires comprising a periphery layer disposed on a periphery of the plurality of wires, the periphery layer comprising one of Sn and Ag and having a thickness in a range from 0.1 µm to 1.0 µm,
wherein the plurality of wires comprises a Cu—Ag alloy comprising 1.0 mass % to 5.0 mass % of Ag.

8. An electromagnetic shielding filter, comprising:
two transparent boards; and
a conductive mesh comprising a plurality of wires, the conductive mesh being sandwiched between the two transparent boards,
wherein the plurality of wires comprises a Cu—Ag alloy comprising 1.0 mass % to 5.0 mass % of Ag, and
wherein the plurality of wires further comprises one of an Sn layer and an Ag layer with a thickness of 0.1 µm to 1.0 µm formed on a periphery thereof.

9. The electromagnetic shielding filter according to claim 8, wherein the two transparent boards comprise a thickness of 0.01 mm to 0.5 mm.

10. The electromagnetic shielding filter according to claim 8, wherein the plurality of wires further comprises a diameter of not less than 10 µm and less than 25 µm, and
wherein the conductive mesh further comprises an aperture of 85% to 95%.

* * * * *